United States Patent
Tsin et al.

(10) Patent No.: US 12,061,244 B2
(45) Date of Patent: Aug. 13, 2024

(54) SYSTEM AND METHOD FOR IN-VEHICLE RADIATION DETECTION AND REDUCTION

(71) Applicant: V-HOLA LABS LTD., Kfar Saba (IL)

(72) Inventors: Asaf Tsin, Kfar Saba (IL); Lior Emer, Petah Tikva (IL); Haim Elgavi, Rosh Haain (IL)

(73) Assignee: V-HOLA LABS LTD., Klar Saba (IL)

( * ) Notice: Subject to any disclaimer, the term of this patent is extended or adjusted under 35 U.S.C. 154(b) by 452 days.

(21) Appl. No.: 17/418,230

(22) PCT Filed: Dec. 26, 2019

(86) PCT No.: PCT/IL2019/051418
§ 371 (c)(1),
(2) Date: Jun. 24, 2021

(87) PCT Pub. No.: WO2020/136655
PCT Pub. Date: Jul. 2, 2020

(65) Prior Publication Data
US 2022/0065952 A1    Mar. 3, 2022

Related U.S. Application Data (60) Provisional application No. 62/784,847, filed on Dec. 26, 2018.

(51) Int. Cl.
*G01R 33/02* (2006.01)
*G08B 21/18* (2006.01)

(52) U.S. Cl.
CPC ....... *G01R 33/0206* (2013.01); *G08B 21/182* (2013.01)

(58) Field of Classification Search
CPC .............. G01R 33/0206; G01R 31/001; G01R 31/006; G01R 29/0814; G08B 21/182; G08B 21/12; G08B 21/02
See application file for complete search history.

(56) References Cited

U.S. PATENT DOCUMENTS

| 6,693,536 B2 | 2/2004 | Bauer Jr et al. |
| 8,537,050 B2 * | 9/2013 | Freeman ............ G01R 29/0892 342/13 |

(Continued)

FOREIGN PATENT DOCUMENTS

| CN | 208249829 U | 12/2018 |
| DE | 102013225241 A1 | 6/2015 |

OTHER PUBLICATIONS

PCT International Search Report for International Application No. PCT/IL2019/051418, mailed Mar. 22, 2020, 3pp.

(Continued)

*Primary Examiner* — Christopher P McAndrew
*Assistant Examiner* — Zannatul Ferdous
(74) *Attorney, Agent, or Firm* — The Roy Gross Law Firm, LLC; Roy Gross (57) ABSTRACT

A system and a method of in-vehicle electromagnetic (EM) radiation detection to be executed by at least one processor, are disclosed. The method may include: receiving one or more indications related to emission vectors of EM fields generated by one or more radiating components; receiving an area of interest in the vehicle; calculating the EM field for at least one location within the area of interest by vector addition of the emission vectors of the EM fields at the at the at least one location; and identifying at least one location having an intensity of the calculated EM field, higher than one or more threshold values.

12 Claims, 5 Drawing Sheets

(56) References Cited

U.S. PATENT DOCUMENTS

| | | | |
|---|---|---|---|
| 9,602,299 B1 | 3/2017 | Misener et al. | |
| 2003/0080277 A1* | 5/2003 | Bauer, Jr. | G01R 29/0814 |
| | | | 250/205 |
| 2006/0139159 A1 | 6/2006 | Lee et al. | |
| 2006/0220635 A1* | 10/2006 | Kazama | G01R 31/002 |
| | | | 324/76.11 |
| 2011/0030113 A1* | 2/2011 | Imholt | A42B 3/20 |
| | | | 2/6.7 |
| 2011/0065375 A1 | 3/2011 | Bradley | |
| 2011/0309945 A1 | 12/2011 | Hyde et al. | |
| 2013/0049955 A1 | 2/2013 | Hoover et al. | |
| 2016/0148448 A1* | 5/2016 | Blatz | G06K 7/10257 |
| | | | 340/5.61 |
| 2019/0125443 A1* | 5/2019 | Prakash | A61B 90/10 |

OTHER PUBLICATIONS

PCT Written Opinion for International Application No. PCT/IL2019/051418, mailed Mar. 22, 2020, 5pp.

PCT International Preliminary Report on Patentability for International Application No. PCT/IL2019/051418, issued Jun. 16, 2021, 6pp.

* cited by examiner

SYSTEM AND METHOD FOR IN-VEHICLE RADIATION DETECTION AND REDUCTION

CROSS REFERENCE TO RELATED APPLICATIONS

This application is a National Phase of PCT Patent Application No. PCT/IL2019/051418 having International filing date of Dec. 26, 2019, which claims the benefit of priority under 35 U.S.C. § 119(e) of U.S. Provisional Application No. 62/784,847, filed on Dec. 26, 2018. The contents of the above applications are all incorporated by reference as if fully set forth herein in their entirety.

FIELD OF THE INVENTION

The present invention relates generally to electromagnetic radiation detection. More specifically, the present invention relates to electromagnetic radiation detection and reduction inside vehicles.

BACKGROUND OF THE INVENTION

Electric vehicles are the transportation means of the future. Electric and hybrid cars are already run in millions on roads all over the world, and electric airplanes and ships are under developments. These vehicles include many electronic components that may emit electromagnetic (EM) radiation that may accumulate, for example, in the passengers' cabin. Such a radiation, if above a certain level may be harmful, thus should be at least mapped and optionally also dealt with.

Accordingly, there is a need for a system and a method for detecting, mapping and reducing harmful ration levels in at least some locations in electric vehicles.

SUMMARY OF THE INVENTION

Some aspects of the invention may be related to a system and a method of in-vehicle electromagnetic (EM) radiation detection to be executed by at least one processor. The method may include: receiving one or more indications related to emission vectors of EM fields generated by one or more radiating components; receiving an area of interest in the vehicle; calculating the EM field for at least one location (e.g., a passenger's seat, driver's head restraint etc.) within the area of interest by vector addition of the emission vectors of the EM fields at the at least one location; and identifying at least one location having an intensity of the calculated EM field, higher than one or more threshold values.

In some embodiments, the one or more indications related to emission vectors of the EM field are received from a plurality of sensing units assembled at the closest assembling location to each radiating component. In some embodiments, each sensing unit comprises: 3 EM sensors, assembled orthogonal to each other, each configured to measure EM field in a specific direction. In some embodiments, each sensing unit comprises a single EM sensor configured to measure a 3D EM field. In some embodiments, the one or more indications related to emission vectors of the EM field are received from calculations using the operation parameters of at least some of the radiating components.

In some embodiments, the method may further include: receiving, for the vehicles' processor, for one or more radiating components operation parameters; calculating the indications related to emission vectors of EM field based on the received operation parameters. In some embodiments, receiving the one or more indications is at predetermined time intervals. In some embodiments, the area of interest is at least one of: a passengers' cabin, a cockpit and at least one vehicle's computer.

In some embodiments, the radiating components are at least some of: the vehicle's electric motor, the vehicle's battery, the vehicle's electric wires, at least one of the vehicle's computers, the vehicle's power inventers, the vehicle's relay switches and the vehicle's radiofrequency (RF) components. In some embodiments, the threshold value is determined based on at least one of: regulatory requirements, manufacturers decision and fleet management decision.

In some embodiments, the method may further include: determining if for each identified node, the node is located at a critical area. In some embodiments, a critical area is one of: an area occupied by one of: a human and an animal, and a vehicle's electronic component sensitive of EM radiation.

In some embodiments, the method may further include: reducing the intensity of the EM field at each critical area by altering the operation parameters of at least one radiating component. In some embodiments, altering the operation parameters of at least one radiating component is conducted such that a safety of the driving is unharmed. In some embodiments, altering the operation parameters of at least one radiating component comprises one of: reducing the current supplied to the component, reducing the current charging a battery and shutting down the component.

Some additional aspects of the invention may be related to a system and a method of EM radiation in an area of interest in a vehicle, to be executed by at least one processor, the method may include: receiving an indication that at one or more locations at the area of interest EM radiation levels are above one or more threshold levels; and reducing the intensity of the EM radiation at the one or more locations by altering the operation parameters of at least one of the vehicle's radiating component.

In some embodiments, altering the operation parameters of at least one radiating component is conducted such that a safety of the driving is unharmed. In some embodiments, altering the operation parameters of at least one radiating component comprises one of: reducing the current supplied to the component, reducing the current charging a battery and shutting down the component. In some embodiments, receiving the indication is from one or more EM sensors located at the area of interest. In some embodiments, receiving the indication is by calculating the intensity of the EM radiation at at least one location in the area of interest.

In some embodiments, the area of interest is at least one of: a passengers' cabin, a cockpit and the vehicle's computer. In some embodiments, the vehicle's radiating components are at least some of: the vehicle's electric motor, the vehicle's battery, the vehicle's electric wires, the vehicle's computer, the vehicle's power inventers, the vehicle's relay switches and the vehicle's radiofrequency (RF) components. In some embodiments, the one or more threshold levels are determined based on regulatory requirements, manufacturers decision and fleet management decision.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention. Some features or elements described with respect to one embodiment may be combined with features or elements described with respect to other embodiments. For the sake of clarity, discussion of same or similar features or elements may not be repeated.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term set when used herein may include one or more items. Unless explicitly stated, the method embodiments described herein are not constrained to a particular order or sequence. Additionally, some of the described method embodiments or elements thereof can occur or be performed simultaneously, at the same point in time, or concurrently.

The term set when used herein can include one or more items. Unless explicitly stated, the method embodiments described herein are not constrained to a particular order or sequence. Additionally, some of the described method embodiments or elements thereof can occur or be performed simultaneously, at the same point in time, or concurrently.

Embodiments of the present invention disclose a method and a system for detection and reduction of EM radiation in an area of interest in a vehicle. Such area of interest may be the passengers' cabin, the vehicles computer or any other area in the vehicle that include components that may be ill affected from EM radiation. The origin of the EM radiation may be from components included in the vehicle (e.g., an electric or hybrid vehicle). Such components may include, for example, the vehicle's electric motor, the vehicle's battery, the vehicle's electric wires, the vehicle's computer, the vehicle's power inverters, the vehicle's relay switches, the vehicle's radiofrequency (RF) components, Autonomous vehicle's processor, integrated or standalone (after market) product, and the like As used herein, a "vehicle" may be any form of transportation that includes one or more EM radiating components. For example, a vehicle may be, an electric car, a hybrid car, an electric bus, an electric train, an electric ship, an electric airplane and the like.

As used herein, an "EM radiation" may refer to the entire EM spectrum. More specifically, the EM radiation may refer to several more specific spectrums, for example, ultraviolet (UV) 3-30 PHz, infrared (IR) 300 GHz-3 PHz, spectrums included in the radiofrequency (RF) spectrum (3 Hz-300 GHz), such as extremely low frequency (ELF) 3-30 Hz, supper low frequency (SLF) 30-300 Hz, ultra-low frequency (ULF) 300-3 KHz, RF broadcasting bands 3 KHz-300 GHz and the like. As known in the art, the higher the frequency the lower is the hazardous impact of the radiation on a subject.

As used herein, a "radiating component" may be any component of the vehicle that radiates an EM radiation (at any spectrum). Some example so for radiating components radiating EM radiation at the ELF may include: the vehicle's electric motor, the vehicle's battery, the vehicle's electric wires, at least one of the vehicle's computers (e.g., an HPC architecture of electrical vehicles), the vehicle's power inverters, the vehicle's relay switches and the like. Additional example, for radiating components radiating EM radiation at the wireless RF range, may include, the vehicles' Bluetooth communication device, a GPS antenna, cellular radio module, WiFi radio module and the like.

As used herein, an "area of interest" may include any area, volume, place in the vehicle that may be affected from the presence of EM radiation above a certain level. For example, the area of interest may include, the passenger's cabin, a cockpit, at least one of the vehicle's electronic components sensitive to EM radiation (e.g., computers) and the like. An electronic component sensitive to EM radiation is a component to which exposure to EM radiation may affect the component's performance.

Figure 1:
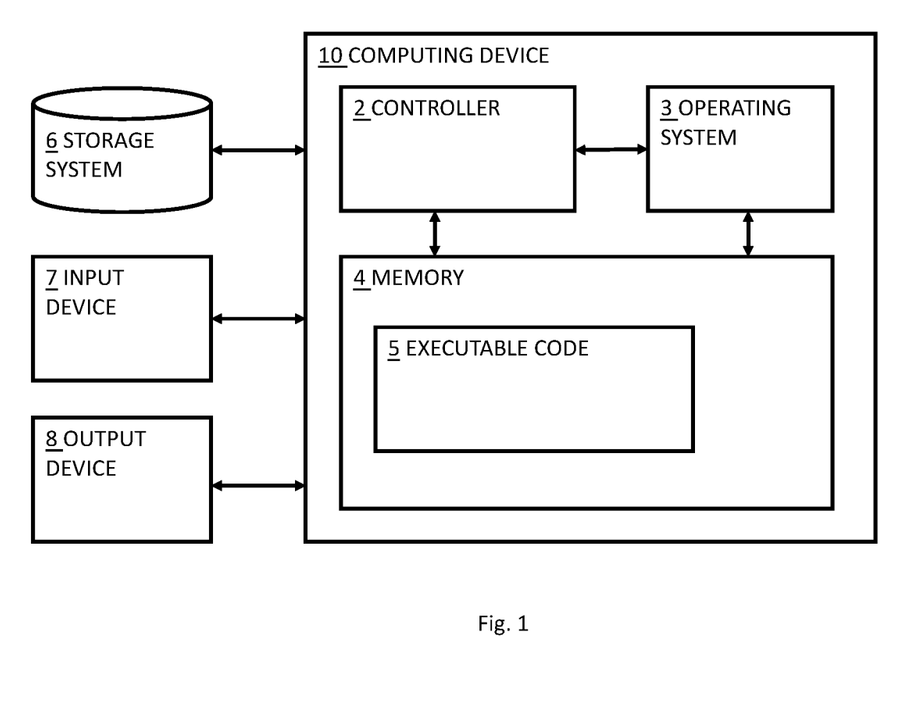
FIG. 1 is a block diagram, depicting a computing device which may be included in a system according to some embodiments of the invention.

Reference is now made to FIG. 1, which is a block diagram depicting a computing device, which may be included within a system for in-vehicle EM radiation detection and/or reduction, according to some embodiments. A computing device, such as device 10 may be included in the vehicles computing system. In some embodiments more than one computing device 10 may be included in the vehicles computing system.

Computing device 10 may include a controller 2 that may be, for example, a central processing unit (CPU) processor, a chip or any suitable computing or computational device, an operating system 3, a memory 4, executable code 5, a storage system 6, input devices 7 and output devices 8. Controller 2 (or one or more controllers or processors, possibly across multiple units or devices) may be configured to carry out methods described herein, and/or to execute or act as the various modules, units, etc. More than one computing device 1 may be included in, and one or more computing devices 1 may act as the components of, a system according to embodiments of the invention.

Operating system 3 may be or may include any code segment (e.g., one similar to executable code 5 described herein) designed and/or configured to perform tasks involving coordination, scheduling, arbitration, supervising, controlling or otherwise managing operation of Computing device 1, for example, scheduling execution of software programs or tasks or enabling software programs or other modules or units to communicate. Operating system 3 may be a commercial operating system. It will be noted that an operating system 3 may be an optional component, e.g., in some embodiments, a system may include a computing device that does not require or include an operating system 3.

Memory 4 may be or may include, for example, a Random Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 4 may be or may include a plurality of, possibly different memory units. Memory 4 may be a computer or processor non-transitory readable medium, or a computer non-transitory storage medium, e.g., a RAM. In one embodiment, a non-transitory storage medium such as memory 4, a hard disk drive, another storage device, etc. may store instructions or code which when executed by a processor may cause the processor to carry out methods as described herein.

Executable code 5 may be any executable code, e.g., an application, a program, a process, task or script. Executable code 5 may be executed by controller 2 possibly under control of operating system 3. For example, executable code 5 may be an application that may conduct in-vehicle electromagnetic (EM) radiation detection and/or reduction as further described herein. Although, for the sake of clarity, a single item of executable code 5 is shown in FIG. 1, a system according to some embodiments of the invention may include a plurality of executable code segments similar to executable code 5 that may be loaded into memory 4 and cause controller 2 to carry out methods described herein.

Storage system 6 may be or may include, for example, a flash memory as known in the art, a memory that is internal to, or embedded in, a micro controller or chip as known in the art, a hard disk drive, a CD-Recordable (CD-R) drive, a Blu-ray disk (BD), a universal serial bus (USB) device or other suitable removable and/or fixed storage unit. For example, parameters of the vehicle, (virtual) meshing of the vehicle, the location of EM sensing units and/or the locations of radiating components may be stored in storage system 6 and may be loaded from storage system 6 into memory 4 where it may be processed by controller 2. In some embodiments, some of the components shown in FIG. 1 may be omitted. For example, memory 4 may be a non-volatile memory having the storage capacity of storage system 6. Accordingly, although shown as a separate component, storage system 6 may be embedded or included in memory 4. In some embodiments, storage system 6 may be a cloud base storage system.

Input devices 7 may be or may include any suitable input devices, components or systems, e.g., a detachable keyboard or keypad, a mouse and the like. Output devices 8 may include one or more (possibly detachable) displays or monitors, speakers and/or any other suitable output devices. Any applicable input/output (I/O) devices may be connected to Computing device 10 as shown by blocks 7 and 8. For example, a wired or wireless network interface card (NIC), a universal serial bus (USB) device or external hard drive may be included in input devices 7 and/or output devices 8. It will be recognized that any suitable number of input devices 7 and output device 8 may be operatively connected to Computing device 1 as shown by blocks 7 and 8.

A system according to some embodiments of the invention may include components such as, but not limited to, a plurality of central processing units (CPU) or any other suitable multi-purpose or specific processors or controllers (e.g., controllers similar to controller 2), a plurality of input units, a plurality of output units, a plurality of memory units, and a plurality of storage units.

Figure 2:
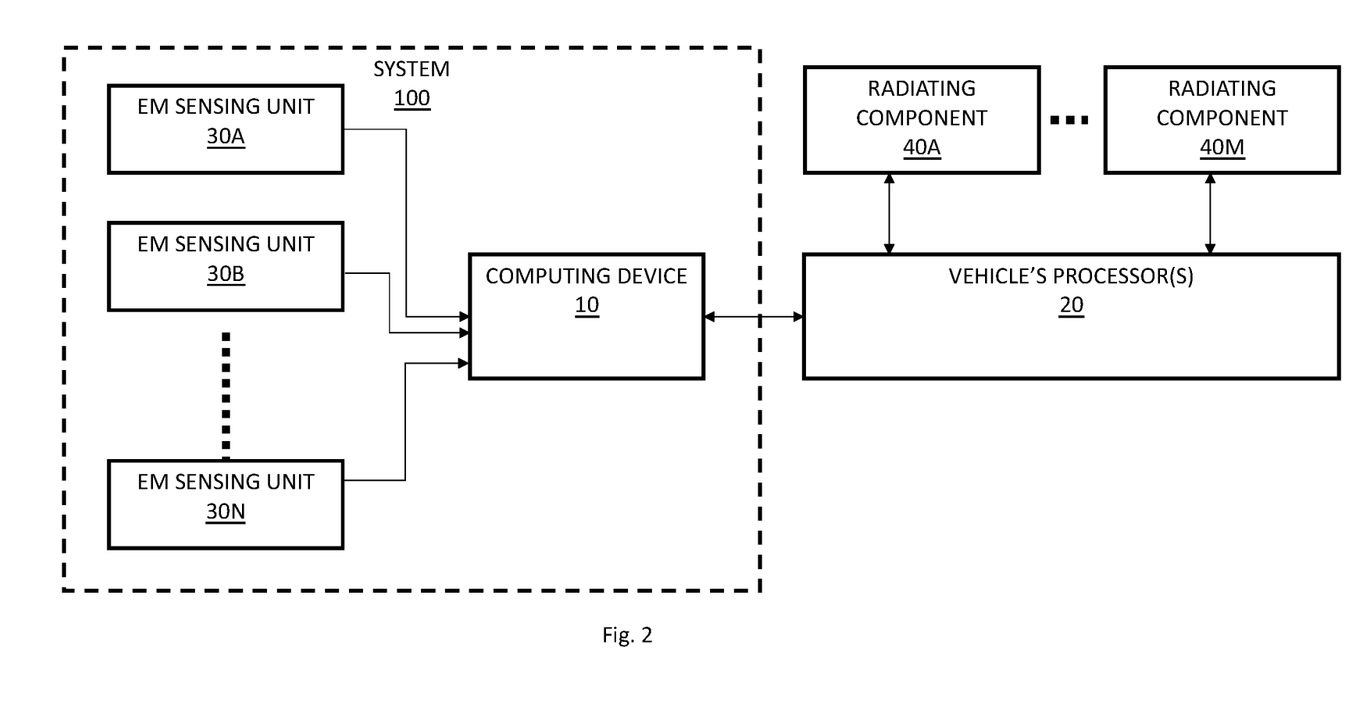
FIG. 2 is a block diagram, depicting a system for in-vehicle EM radiation detection according to some embodiments.

Reference is now made to FIG. 2, which is a block diagram of a system for detection and/or reduction of in-vehicle EM radiation according to some embodiments of the invention. A system such as system 100 may include a computing device 10 that may be in communication with one or more of the vehicle's computers 20, for example, via I/O devices 7 and 8. In some embodiments, system 100 may include or may be in communication with one or more EM sensing units 30A-30N. As should be understood by one skilled in the art the three sensing units illustrated in FIG. 2 are given as an example only and any number of EM sensing units can be included in the invention. In some embodiments, EM sensing units 30A-30N may communicate with computing device 10 via either wired or wireless communication using any known protocol (e.g., LAN, Bluetooth and the like).

In some embodiments, EM sensing units 30A-30N may include any sensing unit configured to detect an emission vector of an EM field generated by a component of the vehicle. In some embodiments, units 30A-30N may each include a single EM sensor configured to measure a 3D EM field (e.g., a magnetic field). In some embodiments, units 30A-30N may each include 3 EM sensors, each configured to measure an EM field (e.g., magnetic field) in a single direction. In such embodiments, the EM sensors may be assembled orthogonal to each other, each configured to measure EM field (e.g., a magnetic field) in a specific direction orthogonal to the direction of the field measured by the two other EM sensors. For example, the sensors may be Anisotropic Magnetoresistive (AMR) Sensors, such as, Honeywell HMC104, available from Honeywell, Hall Effect sensors, such as, DRV5053 available from Texas, Instruments, and the like.

In some embodiments, EM sensing units 30A-30N may be assembled at the closest assembling location to each radiating component. For example, a sensing unit 30A may be assembled on the envelop of the vehicle's electric motor.

In another example, a sensing unit 30B may be attached to a wire of the vehicle. In yet another example, a sensing unit 30C may be attached to the Bluetooth device of the vehicle.

In some embodiments, the vehicle may include a plurality of vehicle computers 20 and system 100 may communicate with at least one vehicle computer 20, which may be a computing device, such as computing device 10.

In some embodiments, radiating components 40A-40M may be any component of the vehicle that radiates an EM radiation (at any spectrum). Some example of radiating components radiating EM radiation may include: the vehicle's electric motor, the vehicle's battery, the vehicle's electric wires, at least one of the vehicle's computers 20, the vehicle's power inventers, the vehicle's relay switches, the vehicle's audio or multimedia system, a Bluetooth communication device, a GPS antenna, and the like.

Figure 3:
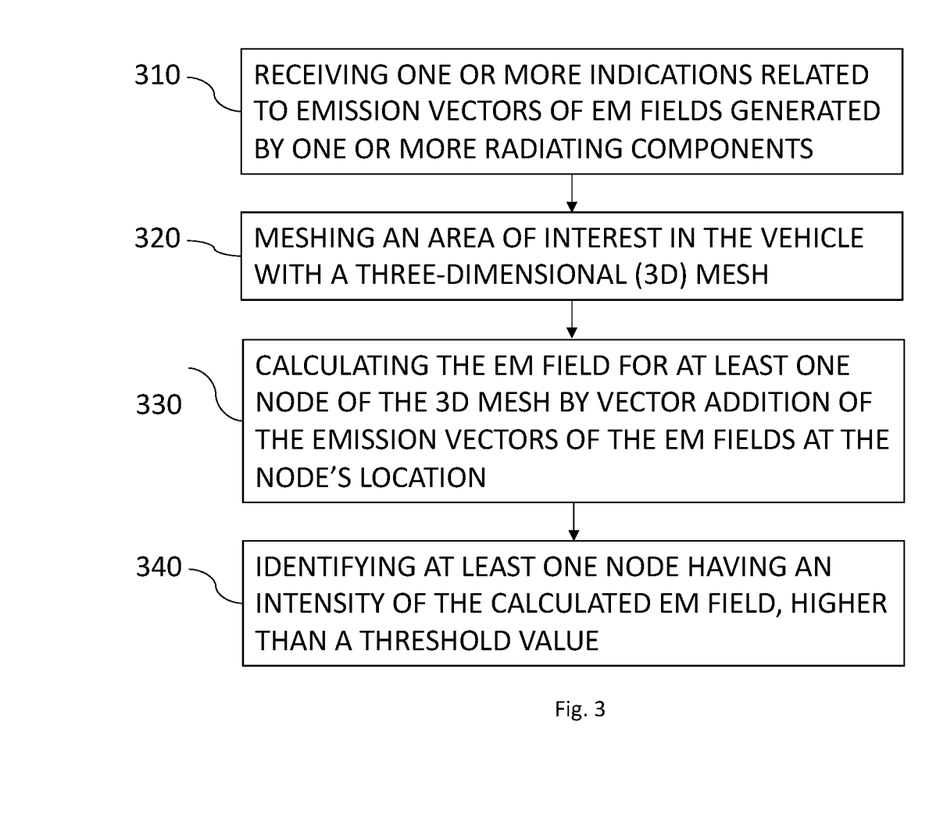
FIG. 3 is a flowchart of a method of in-vehicle EM radiation detection according to some embodiments of the invention.

Reference is now made to FIG. 3 which is a flowchart of a method of in-vehicle electromagnetic (EM) radiation detection to be executed by at least one processor (e.g., controller 2 of computing device 10) according to some embodiments of the invention. In step 310, the processor may receive one or more indications related to emission vectors of EM fields generated by one or more radiating components. For example, controller 2 may receive from one or more EM sensing units 30A-30N the size and direction of the EM field generated by the one or more radiating components 40A-40M associated with each EM sensing units 30A-30N. In some embodiments, controller 2 may also receive from a database the location of each sensing unit 30A-30N in the vehicle.

In another example, controller 2 may receive from one or more vehicles computers 20 operation parameters (e.g., the current flowing in, to, or from an electric component) of at least one radiating component 40A-40M, in real time. In some embodiments, controller 2 may be configured to calculate the indications related to emission vectors of EM field based on the received operation parameters, for example, by calculating the size and direction of the magnetic field using equation (1):

$$\overrightarrow{B_j} = \frac{\mu_0 \vec{\imath}}{2\pi r} \quad (1)$$

Wherein, $\vec{B}$ is the EM emission vector (e.g., the magnetic field vector) generated by radiation component j (j=1 to M), i the current flowing in, to, or from an electric component and r the distance from the radiating component.

In some embodiments, receiving the one or more indications may be conducted at predetermined time intervals. For example, one or more indications may be received form sensing units 30A-30N or may be calculated every several seconds, for example, every 0.1, 0.5, 1, 2, 3, or 4 second. In some embodiments, the time interval may be determined such that it will not exceed the maximum allowed exposure time according to safety regulation (e.g., 6 minutes). In some embodiments, the longer the time of exposure the higher is the risk for harmful damage (either to a human, an animal or an electronic components). Accordingly, a maximum allowed exposure time is defined by the International Commission on Non-Ionizing Radiation Protection (ICNIRP). World Health Organization (WHO) instructions as well as regulatory bodies worldwide instructions derive from ICNRIP's recommendations. ICNIRP update its recommendations from time to time.

Figure 4:
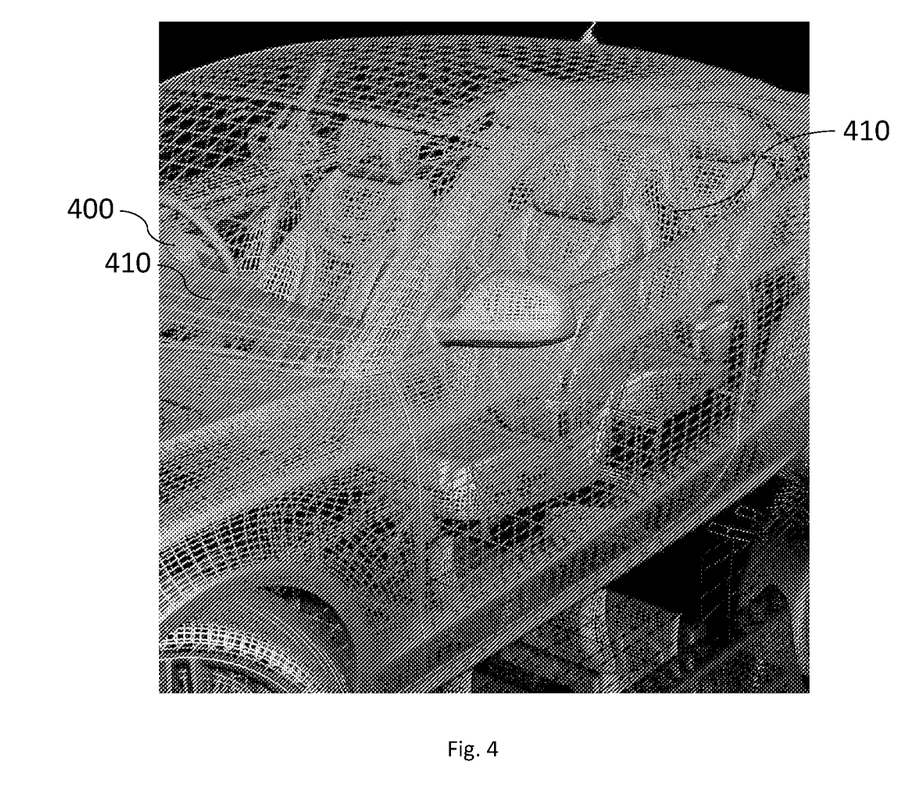
FIG. 4 is an illustration of a virtual 3D mesh of a passengers' cabin of a vehicle according to some embodiments of the invention.

In step 320, an area of interest in the vehicle is (virtually) meshed with a three-dimensional (3D) mesh. The mesh may be received form the vehicle's manufacturers, for example, mesh 400 illustrated in FIG. 4 or may be calculated based the vehicle's parameters. It should be appreciated that according to some embodiments meshing may not be required and alternative methods of determining locations within an area of interest may be used. For example, preset locations may be used such as specific locations within a passenger's cabin (e.g., a seat, a head restraint, etc.). In some embodiments, the mesh and/or vehicle's parameters may be stored in a database, for example, storage system 6. In some embodiments, the mesh may include one or more nodes 410, which are defined as points on the mesh located at intersection of two or more mesh lines. Each node is located at a specific known location in the vehicle. Accordingly, controller 2 may calculate the distance of each node from each sensing unit 30A and/or radiating components 40A-40M. In some embodiments, controller 2, may use the distance as "r" in equation (1) to calculate the size of the magnetic field generated by each radiating components 40A-40M at a certain node. As can be understood from equation (1) the closer the subject (e.g., human, animal or electric component) to the radiation source the higher is the intensity of the EM field. Since the intensity is proportional to $B^2$ the intensity decays in $$\frac{1}{r^2}.$$

In some embodiments, controller 2 may adjust the readings received form one or more sensing units 30A-30N based on the distance between each sensing unit and the node using for example, equation (1). Controller 2 may receive the distance between a sensing unit and the closest radiating element, and the distance form the radiating element to the node.

In step 330, the EM field of at least one node of the 3D mesh may be calculated by vector addition of the emission vectors of the EM fields at the node's location. For example, for at least one node all the magnetic fields vector calculated for each radiating components 40A-40M may be summed, using equation (2).

$$\overrightarrow{B_{node}} = \sum_{M}^{1} B_j \quad (2)$$

In some embodiments, controller 2 may calculate the exposure time T to the radiation levels using equation (3). The Exposure time is defined as the maximum time one is allowed to be exposed to a certain radiation filed (e.g., $\vec{B^7}$) without being harmed.

$$T < \frac{a}{B_{node}} \quad (3)$$

Wherein a is a constant determined based on at least one of: regulation requirements, the subject exposed (e.g., human, animal, electronic equipment, etc.) and the like.

In step 340, at least one node, having an intensity of the calculated EM field, higher than one or more threshold values, may be identified. In some embodiments, the one or more threshold values may be determined based on at least one of: regulatory requirements, manufacturers decision, fleet management decision and the like. In some embodiments, nodes located at different areas of the vehicle may be identified using different threshold values. For example, different threshold values may be determined for EM filed in the passengers' cabin than to one of vehicles computers 20 or to any other electronic component sensitive to EM radiation. For example, the threshold values for passengers' cabin may be determined based on regulation set by the International Commission on Non-Ionizing Radiation Protection (ICNIRP), the World Health Organization (WHO) instructions as well as regulatory bodies worldwide instructions derive from ICNRIP's recommendations. ICNIRP update its recommendations from time to time. In another example, the threshold levels/values for electronic components may be determined based on the defined by EMC compliance for vehicles set be, for example, the manufacturer of the vehicle. The electromagnetic compatibility (EMC) is the ability of electrical equipment and systems to function acceptably in their electromagnetic environment.

In some embodiments, controller 2 may be configured to determine if the identified one or more nodes may be located inside critical areas within the area of interest, for example, the driver's seat, a passenger seat, if a passenger occupies the seat, a sensitive element in the sensitive electronic component (e.g., the electric device which handles the airbag) and the like.

In some embodiments, controller 2 may form and display (e.g., via output device 8) a 3D map (e.g. heat-map) of the radiation levels at the area of interest. In some embodiments, controller 2, may send to a user (e.g., via a user device associated with computer 20) an alert that the levels of EM radiation in at least some location in the area of interest exceeded at least one threshold value. In some embodiments, the 3D maps may be stored in a database, for example, on the cloud based storing service.

In some embodiments, controller 2 may alter the operation of at least one radiating component 40A-40M to reduce the EM radiation in at least the critical areas, as disclose and discussed herein below with respect to the method of FIG. 5. Therefore, a system and method according to some embodiments of the invention can prevent, in real time during driving the exposure of human, animals or sensitive electronic components to harmful levels of EM radiation, taking into consideration the driving Functional Safety (such as, defined in ISO26262).

Figure 5:
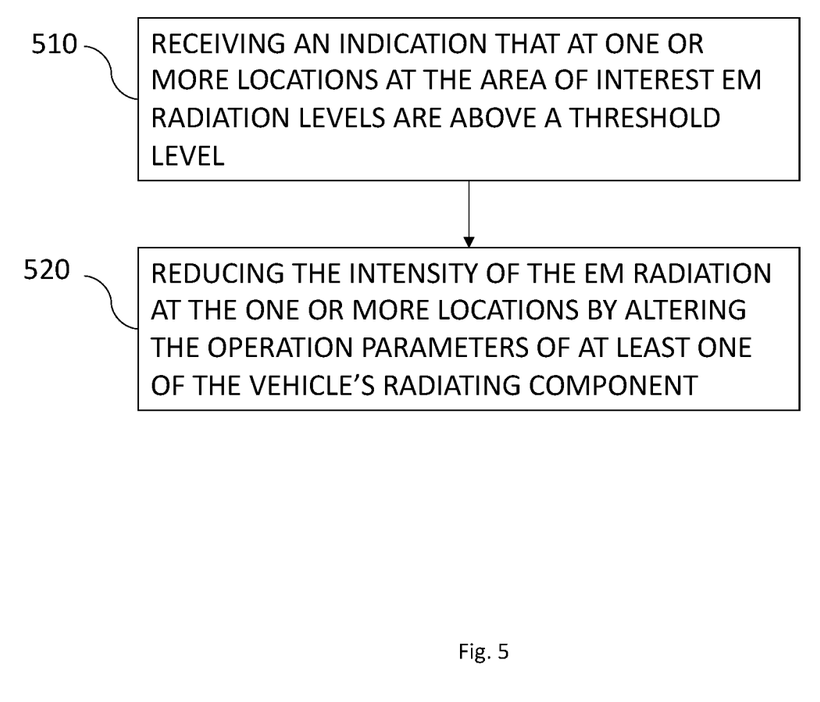
FIG. 5 is a flowchart of a method of reducing EM radiation in an area of interest in a vehicle according to some embodiments of the invention.

Reference is now made to FIG. 5 which is a flowchart of a method of reducing EM radiation in an area of interest in a vehicle, to be executed by at least one processor (e.g., controller 2). In step 510, an indication that at one or more locations at the area of interest, EM radiation levels are above one or more threshold levels, may be received. In some embodiments, controller 2 may execute any of the method steps of FIG. 3 disclosed herein above in order to identify locations (e.g., related to nodes) in the area of interest at which EM radiation levels are above one or more threshold levels, for example, identifying critical areas. In some embodiments, controller 2 may receive the EM radiation levels from sensors located at the area of interest, for example, at critical locations. For example, a sensor, such as for example, but not limited to, sensing element 30A may be located near, on or below the driver's seat, attached to the head rest of the driver seat or attached to the head rest of any of the passengers' seats and the like.

Upon detecting that the received EM radiation levels are higher than one or more threshold levels, as discussed above with respect to the method of FIG. 3, controller 2, may in step 520, reduce the intensity of the EM radiation at the one or more locations by altering the operation parameters of at least one of the vehicle's radiating component. In some embodiments, altering the operation parameters of at least one radiating component may include one of: reducing the current supplied to the component, reducing the current charging a battery, shutting down the component and the like. For example, controller 2 may instruct at least one of vehicle's computers 20 to limit the current provided from the battery to the electric motor, even if the driver is pressing the power paddle, causing the wires and the electric motor to generate a lower magnetic field (see equation 1) thus emitting lower EM radiation. In another example, controller 2 may instruct at least one of vehicle's computer 20 to avoid full recharging of the vehicle's battery during braking, thus reducing the current provided to the battery. In yet another example, controller 2 may instruct at least one of vehicle's computers 20 to shut down the audio system of the vehicle. In some embodiments, altering the operation parameters of at least one radiating component may be conducted such that a safety of the driving is unharmed. Accordingly, only non-critical components, such as the vehicle's audio system can be shutdown in order to reduce the radiation.

Therefore, a system and method according to some embodiments of the invention may allow to increase the safety of both users using the vehicle and electronic components included in the vehicle, by detecting and decreasing the exposure of the harmful EM radiation.

Unless explicitly stated, the method embodiments described herein are not constrained to a particular order or sequence. Furthermore, all formulas described herein are intended as examples only and other or different formulas may be used. Additionally, some of the described method embodiments or elements thereof may occur or be performed at the same point in time.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

The invention claimed is:

1. A method of in-vehicle magnetic field detection to be executed by at least one processor in real-time, the method comprising:
   receiving, from one or more sensing units, one or more indications related to three-dimensional (3D) emission vectors of magnetic fields generated by one or more radiating components, wherein each 3D emission vector comprises 3 magnetic field values in orthogonal directions;
   calculating a magnetic field for at least one location by vector addition of the 3D emission vectors of the magnetic fields at the at least one location;
   identifying at least one location having an intensity of the calculated magnetic field, higher than one or more threshold values; and
   upon identifying the at least one location, controlling the one or more radiating components to reduce the magnetic field in the at least one location.

2. The method of claim 1, wherein the one or more indications related to emission vectors of the EM field are received from a plurality of sensing units assembled at the closest assembling location to each radiating component.

3. The method of claim 2, wherein each sensing unit comprises: 3 EM sensors, assembled orthogonal to each other, each configured to measure EM field in a specific direction.

4. The method of claim 2, wherein each sensing unit comprises a single EM sensor configured to measure a 3D EM field.

5. The method of claim 1, wherein the one or more indications related to emission vectors of the EM field are received from calculations using the operation parameters of at least some of the radiating components.

6. The method of claim 5, further comprising:
receiving, from the vehicles' processor, for one or more radiating components, the operation parameters;
calculating the indications related to the 3D emission vectors of EM field based on the received operation parameters.

7. The method of claim 1, wherein the at least one location is inside an area of interest, and wherein the area of interest is at least one of: a passengers' cabin, a cockpit and at least one vehicle's computer.

8. The method of claim 1, wherein the radiating components are at least some of: the vehicle's electric motor, the vehicle's battery, the vehicle's electric wires, at least one of the vehicle's computers, the vehicle's power inventers, the vehicle's relay switches and the vehicle's radiofrequency (RF) components.

9. The method of claim 1, wherein the threshold value is determined based on at least one of: regulatory requirements, manufacturers decision and fleet management decision.

10. The method of claim 1, further comprising:
identifying nodes; and
determining if for each identified node, the node is located at a critical area,
wherein the critical area is one of: an area occupied by one of: a human and an animal, and a vehicle's electronic component sensitive of EM radiation.

11. A system for in-vehicle magnetic field detection, in real time, the system comprising:
one or more sensing units configured to measure three-dimensional (3D) emission vectors of magnetic fields;
a memory to store thereon instruction; and
a processor configured to:
receive, from the one or more sensors, one or more indications related to emission vectors of magnetic fields generated by one or more radiating components, wherein each 3D emission vector comprises 3 magnetic field values in orthogonal directions;
calculate a magnetic field for at least one location by vector addition of the emission vectors of the magnetic fields at the at least one location;
identify at least one location having an intensity of the calculated EM field, higher than one or more threshold values; and
upon identifying the at least one location, controlling the one or more radiating components to reduce the magnetic field in the at least one location.

12. The method of claim 1, wherein altering the operation parameters of the at least one radiating component comprises at least one of, reducing the current supplied to the component, reducing the current charging a battery, and shutting down the component.

* * * * *